United States Patent
Sekine

(10) Patent No.: US 6,429,038 B2
(45) Date of Patent: *Aug. 6, 2002

(54) SOLID-STATE IMAGING DEVICE AND METHOD OF MANUFACTURING THE SAME

(75) Inventor: Hirokazu Sekine, Fujisawa (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/720,003

(22) Filed: Sep. 27, 1996

(30) Foreign Application Priority Data

Sep. 29, 1995  (JP) .............................. 7-253094

(51) Int. Cl.[7] .............................................. H01L 21/339
(52) U.S. Cl. ............................................... 438/70; 438/75
(58) Field of Search ............................... 438/75, 70, 60

(56) References Cited

U.S. PATENT DOCUMENTS

| | | | | |
|---|---|---|---|---|
| 5,266,501 A | * | 11/1993 | Imai ............................ | 438/60 |
| 5,286,605 A | * | 2/1994 | Nishioka et al. ............. | 430/311 |
| 5,466,612 A | * | 11/1995 | Fuse et al. .................... | 438/70 |
| 5,514,888 A | * | 5/1996 | Sano et al. ................... | 257/232 |
| 5,631,753 A | * | 5/1997 | Hamaguchi et al. ........ | 427/525 |
| 5,708,264 A | * | 1/1998 | Hawkins et al. ............. | 250/226 |
| 5,877,040 A | * | 3/1999 | Park et al. ................... | 438/70 |
| 5,889,277 A | * | 3/1999 | Hawkins et al. ........ | 250/208.1 |

* cited by examiner

*Primary Examiner*—Savitri Mulpuri
(74) *Attorney, Agent, or Firm*—Finnegan, Henderson, Farabow, Garrett & Dunner, L.L.P.

(57) ABSTRACT

A solid-state imaging device provided with color filter in which process margin with respect to color reproducibility at the time of production is increased. This solid-state imaging device includes a semiconductor substrate, light shielding films formed so as to define light opening portions by material of light shielding characteristic above the semiconductor substrate, and color filters formed, in a manner to correspond to the light opening portions, above the light shielding films so that respective end portions thereof are correspondingly positioned within the regions where the light shielding films are respectively formed. In addition, a method of manufacturing such a solid-state imaging device, has the steps of forming a first insulating film on a semiconductor substrate, allowing light shielding material to selectively remain within regions where light shielding films are to be respectively formed on the first insulating film to form the light shielding films, forming a second insulating film in this state, and selectively forming a color filter layer on the second insulating film so as to cover the opening portion surrounded by the light shielding films and to allow the respective end portions to be positioned on the regions where the light shielding films are respectively formed to repeat the above-mentioned process steps to produce solid-state imaging device provided with, e.g., color filters of three colors.

5 Claims, 3 Drawing Sheets

SOLID-STATE IMAGING DEVICE AND METHOD OF MANUFACTURING THE SAME

BACKGROUND OF THE INVENTION

This invention relates to a solid-state imaging (image pick-up) device and a method of manufacturing the same, and more particularly to a solid-state imaging device of the structure comprising color filter and a dyeing layer process in a color filter production process suitable when applied thereto.

The configuration of a conventional solid-state imaging device will now be described with reference to FIGS. 3–5. As shown in FIG. 3, this solid-state imaging device comprises: groups of pixels 51 to 53 two-dimensionally arranged on a semiconductor substrate; vertical CCD shift registers 54 to 56 respectively disposed between these groups of pixels 51 to 53, and adapted for transferring, in a vertical direction, signal charges produced in the pixels after undergone photoelectric conversion and stored therein; a horizontal CCD register 57 adjacently disposed at the lower end portion of the vertical CCD shift registers 54 to 56, and adapted for reading out, in a horizontal direction, signal charges of the vertical CCD shift registers 54 to 56, and an output circuit 58 disposed at the terminating end of the horizontal CCD shift register 57.

This solid-state imaging device is manufactured as follows. Initially, an insulating film 62 is formed on a semiconductor substrate 61 so as to include transfer electrodes 63, 64 (see FIG. 4C) of the vertical CCD shift registers 54 to 56 to form light shielding films 65 on the insulating film 62 so that they are positioned immediately above the transfer electrodes 63, 64 thereafter to form a protective film 66 so as to cover the light shielding films 65. Then, a first color filter pattern 67 is formed on the protective film 66. In this case, the first color filter pattern 67 is formed by coating resist for color filter onto the protective film 66 to carry out mask pattern transfer at a predetermined position with respect to the light shielding films 65 to implement the development processing thereto (FIG. 4A).

Thereafter, similar process is carried out for a second time to respectively form a second color filter pattern 68 (FIG. 4B) and a third color filter pattern 69 (FIG. 4C).

However, with the such conventional manufacturing method, the problem that the color picture characteristic is degraded took place.

Namely, there were instances where, as shown in FIG. 5A, e.g., the first color filter pattern 67 is positionally shifted to the left side with respect to the light shielding film 65 so that gap takes place between the first color filter pattern 67 and the light shielding film 65 of the right side. In such a case, any shift (difference from the ideal characteristic) takes place in the spectral characteristic by the dyeing (coloring) pattern of the first color filter pattern 67. For this reason, unsatisfactory color reproducibility takes place, thus degrading the color picture characteristic to much degree.

Moreover, in a state as described above, as shown in FIG. 5B, there are instances where the third color filter pattern 69 takes a form riding onto the first color filter pattern 67 as indicated by color filter pattern 69' although it is not admitted into the adjacent pixel region. As a result, thick portions locally take place. Thus, any shift would similarly takes place in the spectral characteristic of the first color filter pattern 67.

Further, with miniaturization of the device, the width of the light shielding film 65 between pixels becomes smaller. As a result, with the prior art, the problem that process margin cannot be taken place.

SUMMARY OF THE INVENTION

This invention has been made in view of the problems with the prior art, and its object is to provide a solid-state imaging device of the structure comprising color filter, and a color filter formation process suitable when applied thereto, in which the pattern end portion position of the color filter pattern is determined by the self-alignment with respect to the light shielding film so that the process margin with respect to the color reproducibility is increased.

A solid-state imaging device of this invention comprises: a semiconductor substrate, light shielding films formed so as to define light opening portions by a material of light shielding characteristic above the semiconductor substrate; and color filter layers formed above the light shielding films, and such that they are caused to correspond to the light opening portions and respective end portions thereof are positioned within regions corresponding to regions where the light shielding films are respectively formed.

Transfer electrodes are preferably respectively provided below the light shielding films in a more practical sense.

One of the color filter layers is preferably formed on a certain region where the light shielding film is formed in the state where a gap is held between the end portion thereof and that of the other color filter layer adjacent thereto.

Moreover, a method of manufacturing a solid-state imaging device of this invention comprises the steps of: forming a first insulating film on a semiconductor substrate; allowing a material of light shielding characteristic to selectively remain within regions where light shielding films are to be respectively formed on the fist insulating film to form the light shielding films; forming a second insulating film in this state; selectively forming a color filter layer on the second insulating film so as to cover an opening portion surrounded by the light shielding films and to allow respective end portions thereof to he positioned on the regions where the light shielding films are respectively formed.

Formation of the color filter layer is repeatedly carried out with respect to plural colors.

It is desirable to set light irradiation quantity so that the remaining film ratio (percentage) of the portion positioned on the light shielding film of resist constituting the color filter layer is lower than the remaining film ratio (percentage) of the portion positioned on the light opening portion.

DESCRIPTION OF THE PREFERRED EMBODIMENTS

Figure 1A:
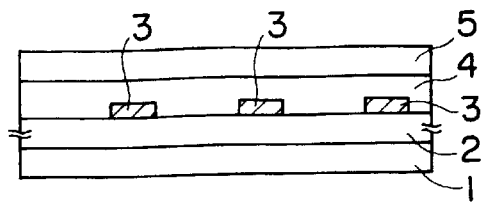
FIGS. 1A–1G are device cross sectional views every process steps showing a manufacturing process of a solid-state imaging device according to an embodiment of this invention.

Preferred embodiments of this invention will now be described with reference to the attached drawings. FIGS. 1A–1G are device cross sectional views every process steps showing a manufacturing process of a solid-state imaging device according to an embodiment of this invention. In FIG. 1A, an insulating film 2 is first formed so as to include transfer electrodes of vertical CCD shift register (not shown) on a semiconductor substrate 1 comprised of, e.g., silicon to form, on the insulating film 2, light shielding films 3 by material having high reflection factor (e.g., Al) so that they are positioned immediately (directly) above the transfer electrodes thereafter to stack a protective film 4 on the entire surface thereof. Thereafter, a resist 5 serving as color filter material of the positive type is coated onto the entire surface of the protective film 4.

Figure 1B:
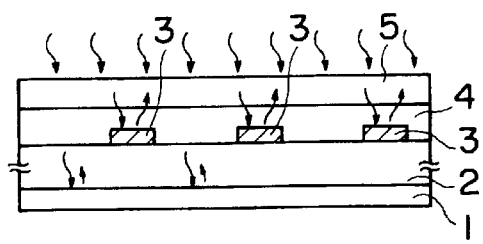

Subsequently, as shown in FIG. 1B, the resist 5 is exposed to light by the entire surface exposure. In this instance, since metal like Al is ordinarily used as the light shielding film 3, this light shielding film has metal gloss. On the other hand, silicon is ordinarily used for the semiconductor substrate 1 as described above. An incident light is admitted (entered) into the substrate 1, and the reflected component thereof is smaller than the reflected component from the light shielding film 3. As a result, by setting of the light irradiation quantity which will be described later, each portion positioned on the light shielding film 3 in the resist 5 is removed to more degree than other portions, or only the portion positioned on the light shielding film 3 is slightly removed so that it is caused to be of the thin film structure. Arrows in the figure indicate action of light such as irradiated light and reflected light, etc.

Figure 1C:
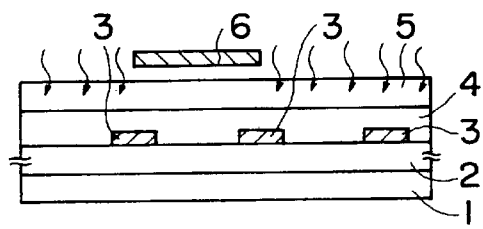
Figure 1D:
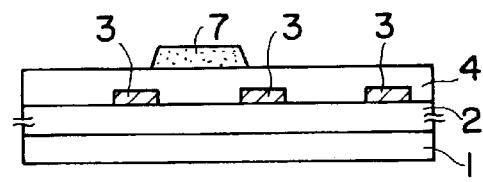

Then, as shown in FIG. 1C, in order to allow a predetermined portion except for the region where color filter is to be formed to be exposed to light, the resist 5 portion corresponding to the portion except for the shield pattern of a photomask 6 is exposed to light. By carrying out development in such a state, as shown in FIG. 1D, only the portion overlapping with the pattern of the photomask 6 at the portion except for the light shielding films 3 is left as a filter pattern 7. Thus, the portions positioned on the light shielding films 3 of the resist 5 are completely removed.

Then, this film pattern 7 is dyed (colored) by a predetermined dyeing material to complete the color filter of one color.

Figure 1E:
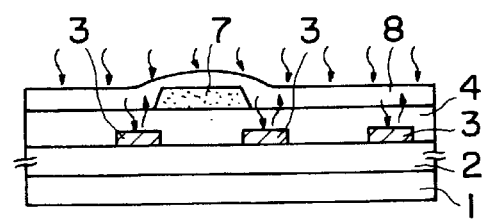

Similarly, as shown in FIG. 1E, a resist 8 serving as filter material of the other color is coated to allow the entire surface thereof to be exposed to light.

Figure 1F:
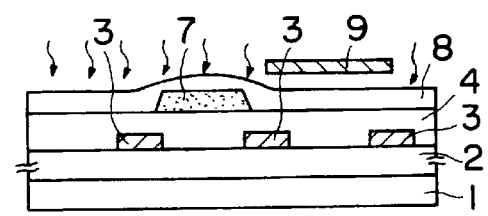

Then, a photomask 9 is provided as shown in FIG. 1F to allow the portion except for the region where the filter pattern is to be formed to be exposed to light.

Thereafter, development is carried out to form a film pattern 10 and the filter pattern 10 is then dyed (colored).

Figure 1G:
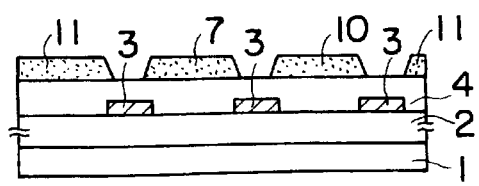

Similarly, a filter pattern 11 of the remaining color is formed as shown in FIG. 1G. Thus, filter patterns 7, 10, 11 of three colors are completed.

Figure 2:
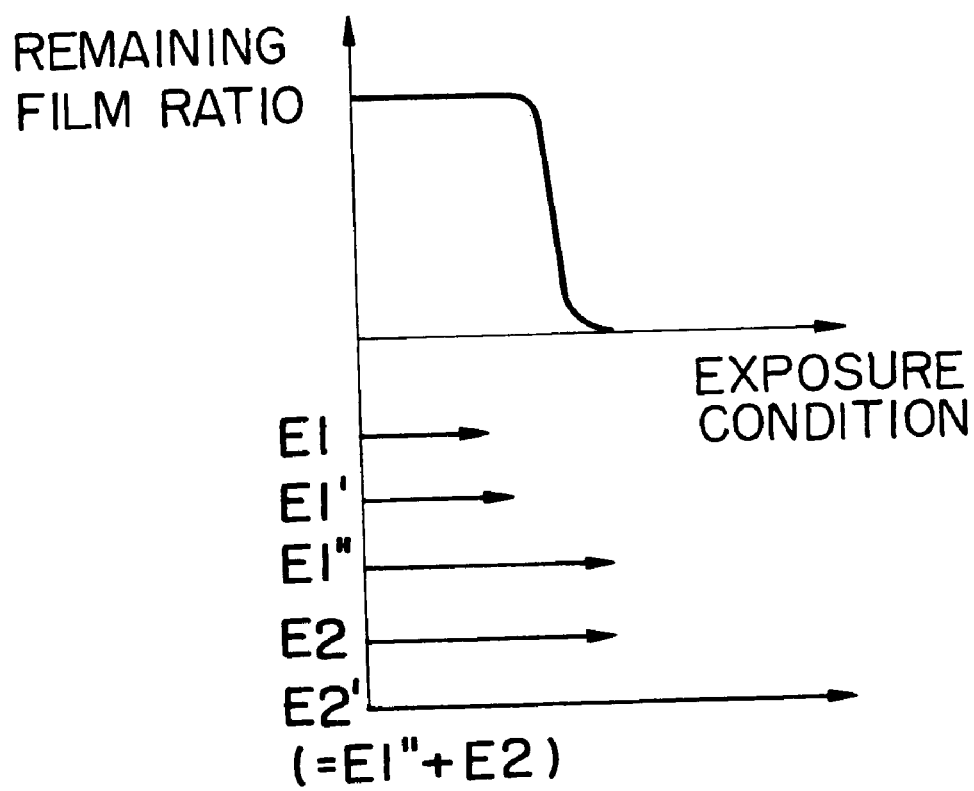
FIG. 2 is a graph showing exposure/development characteristic of resist (remaining film ratio with respect to the exposure quantity (=film thickness after development/film thickness before development)
Figure 3:
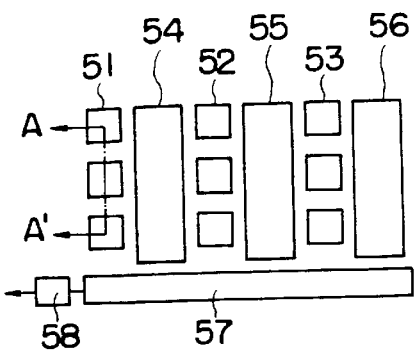
FIG. 3 is a plan view showing outline of the configuration of a conventional solid-state imaging device, FIGS. 4A–4C are device cross sectional views every process steps showing a manufacturing process thereof, and FIGS. 5A and 5B are cross sectional views for explaining the problems of the manufacturing process for the conventional solid-state imaging device.
Figure 4A:
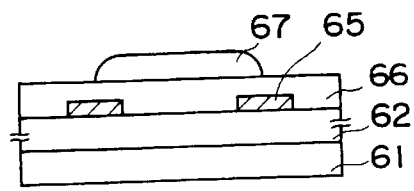
Figure 4B:
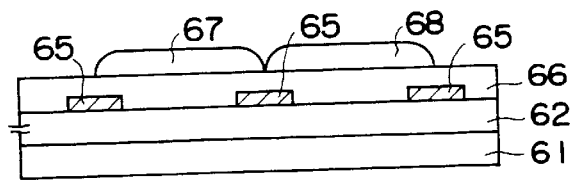
Figure 4C:
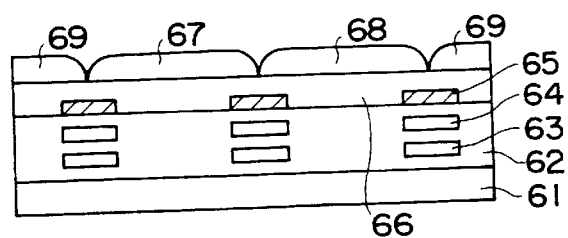
Figure 5A:
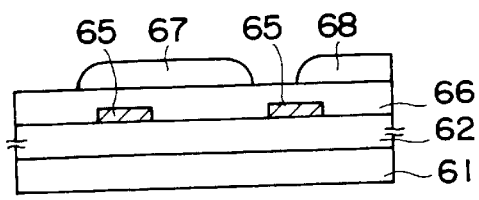
Figure 5B:
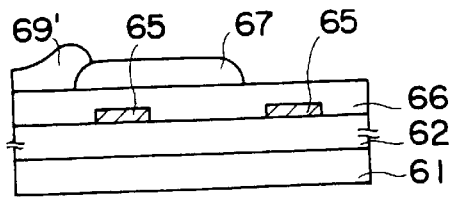

FIG. 2 is the exposure/development characteristic of resist, and shows the characteristic curve of the remaining film ratio with respect to the exposure quantity (=film thickness after development/film thickness before development). It is seen from this characteristic curve that the remaining film ratio suddenly changes with a certain (predetermined) exposure quantity being as the boundary. In this figure, E1 indicates irradiation quantity at the time of the entire surface exposure, E1' indicates irradiation quantity in which quantity of reflected light from the semiconductor substrate 1 surface is added to the irradiation quantity at the time of the entire surface exposure, and E1" indicates irradiation quantity in which quantity of reflected light from the light shielding film 3 is added to irradiation quantity at the time of the entire surface exposure. In addition, E2 indicates irradiation quantity when photomasks 6, 9 are used, and E2' indicates irradiation quantity in which E1" is added to the irradiation quantity when the photomasks 6, 9 are used.

The key point in this invention is that E1, E1' are set so that they fall within the area where the remaining film ratio does not suddenly decreases while setting E1", E2, E2' so that they have the condition where the remaining film ratio of resist becomes nearly equal to zero. When the exposure/development processing is carried out under such a setting, the color filter pattern end portion is in alignment with the pattern end portion of the light shielding film 3 substantially in self-alignment state. For this reason, filter patterns of three colors can be formed without allowing is positional shift of the pattern to take place. Thus, the problem that the color reproducibility is degraded by pattern positional shift does not take place.

While the process according to the embodiment of this invention has been described, several modified examples may be employed in addition to the above in this invention.

For example, this invention can be similarly applied to the color filter formation process of the linear sensor.

In addition, while it has been only described that the color filter pattern is formed by the dyeing layer, this invention can be applied to formation of the lens layer. Particularly, since there is no dyeing layer on the light shielding film, the lens layer can be formed by the entire surface exposure.

As described above, in accordance with this invention, by setting of the condition of respective light irradiation quantities at the time of exposure/development processing in the entire surface exposure and the exposure in which photomask is used, the color filter pattern end portion is in alignment with the pattern end portion of the light shielding film 3 substantially by the self-alignment. For this reason, filter patterns of three colors can be formed without allowing positional shift of the pattern to take plate. Thus, the problem that color reproducibility is degraded by the pattern positional shift does not take place.

What is claimed is:

1. A method of manufacturing a solid-state imaging device, comprising the forming a first insulating layer on a semiconductor substrate;

depositing light shielding material having light reflection characteristics entirely on the first insulating layer;

selectively patterning the light shielding material to form light shielding layers having higher reflection factor than that of the substrate, and light shielding layers being disposed in a region where a CCD shift register is formed thereunder;

forming a second insulating layer on the entire surface;

depositing a photosensitive filter material on the second insulating layer;

setting a photomask having a pattern for covering openings formed by said light shielding layers over the photosensitive filter material; and exposing the photosensitive filter material using a first light directly irradiated and a second light reflected from said light shielding layer to form a patterned filter layer, end portions of the filter layer and those of the light shielding layers being in a self-alignment state.

2. The method of manufacturing a solid-state imaging device according to claim 1, further comprising a step of dyeing the filter layer to form a color filter layer.

3. The method of manufacturing a solid-state imaging device according to claim 2, wherein the filter layer is dyed repeatedly carried out with respect to plural colors so as to form plural color filter layers.

4. The method of manufacturing a solid-state imaging device according to claim 3, wherein at every formation of the color filter layer, the filter layer is dyed with different colors.

5. The method of manufacturing a solid-state imaging device according to claim 1, wherein said photosensitive filter material is a positive type photoresist.

* * * * *